United States Patent
Chen et al.

(10) Patent No.: US 9,660,072 B2
(45) Date of Patent: May 23, 2017

(54) LATERALLY DIFFUSED METAL OXIDE SEMICONDUCTOR AND FIELD DRIFT METAL OXIDE SEMICONDUCTOR

(71) Applicant: UNITED MICROELECTRONICS CORP., Hsin-Chu (TW)

(72) Inventors: Lu-An Chen, Hsinchu County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 61 days.

(21) Appl. No.: 14/188,645

(22) Filed: Feb. 24, 2014

(65) Prior Publication Data

US 2015/0243776 A1    Aug. 27, 2015

(51) Int. Cl.
| | |
|---|---|
| H01L 29/78 | (2006.01) |
| H01L 29/06 | (2006.01) |
| H01L 29/08 | (2006.01) |
| H01L 29/423 | (2006.01) |

(52) U.S. Cl.
CPC ...... *H01L 29/7816* (2013.01); *H01L 29/0623* (2013.01); *H01L 29/0653* (2013.01); *H01L 29/0847* (2013.01); *H01L 29/7835* (2013.01); *H01L 29/0878* (2013.01); *H01L 29/42368* (2013.01)

(58) Field of Classification Search
None
See application file for complete search history.

(56) References Cited

U.S. PATENT DOCUMENTS

| | | | | |
|---|---|---|---|---|
| 6,444,511 B1* | 9/2002 | Wu | .................. | H01L 21/823814 |
| | | | | 257/E21.634 |
| 6,521,946 B2* | 2/2003 | Mosher | ............... | H01L 29/0653 |
| | | | | 257/336 |
| 6,979,875 B2* | 12/2005 | Kwon | ................... | H01L 27/088 |
| | | | | 257/492 |
| 7,135,743 B2* | 11/2006 | Manna | ................ | H01L 27/0266 |
| | | | | 257/355 |
| 7,655,980 B1 | 2/2010 | Chao | | |
| 7,906,810 B2* | 3/2011 | Wang | .................. | H01L 29/1095 |
| | | | | 257/335 |
| 7,910,998 B2 | 3/2011 | Hwang | | |
| 8,110,853 B2* | 2/2012 | Voldman | ............. | H01L 29/0619 |
| | | | | 257/170 |
| 8,507,981 B2* | 8/2013 | Chen | ................ | H01L 29/41758 |
| | | | | 257/335 |

(Continued)

Primary Examiner — Abul Kalam
(74) Attorney, Agent, or Firm — Winston Hsu; Scott Margo

(57) ABSTRACT

A laterally diffused metal oxide semiconductor (LDMOS) is provided. A substrate has a deep well with a second conductive type therein. A gate is disposed on the substrate. A first doped region of a second conductive type and a second doped region of a first conductive type are located in the deep well and at the corresponding two sides of the gate. A drain region of a second conductive type is located in the first doped region. A drain contact is disposed on the drain region. A doped region of a first conductive type is located in the first doped region and under the drain region but not directly below the drain contact. A source region is located in the second doped region. A field drift metal oxide semiconductor (FDMOS) which is similar to the laterally diffused metal oxide semiconductor (LDMOS) is also provided.

6 Claims, 10 Drawing Sheets

(56) References Cited

U.S. PATENT DOCUMENTS

| | | | | |
|---|---|---|---|---|
| 8,723,263 B2* | 5/2014 | Chao | ............... | H01L 27/027 |
| | | | | 257/355 |
| 8,890,250 B2* | 11/2014 | Wang | ............... | H01L 29/7393 |
| | | | | 257/355 |
| 2002/0076876 A1* | 6/2002 | Ker | ............... | H01L 21/823425 |
| | | | | 438/218 |
| 2010/0019318 A1* | 1/2010 | Chao | ............... | H01L 29/7833 |
| | | | | 257/336 |
| 2011/0233673 A1* | 9/2011 | Liu | ............... | H01L 29/0878 |
| | | | | 257/343 |
| 2012/0061758 A1* | 3/2012 | Khan | ............... | H01L 29/0634 |
| | | | | 257/343 |
| 2014/0284720 A1* | 9/2014 | Chen | ............... | H01L 29/78 |
| | | | | 257/355 |

\* cited by examiner

LATERALLY DIFFUSED METAL OXIDE SEMICONDUCTOR AND FIELD DRIFT METAL OXIDE SEMICONDUCTOR

BACKGROUND OF THE INVENTION

1. Field of the Invention

The present invention relates generally to a metal oxide semiconductor (MOS), and more specifically, to a laterally diffused metal oxide semiconductor (LDMOS) and a field drift metal oxide semiconductor (FDMOS).

2. Description of the Prior Art

As metal-oxide semiconductor (MOS) transistors consume less power than traditional transistors and can be highly integrated, they are widely used in the semiconductor industry. When a proper voltage is inputted, MOS transistors can be used as a switch to control the flow of electricity through a device. In high voltage circuits, such as the input and output terminals of electrical equipment, laterally diffused metal oxide semiconductor (LDMOS) transistors and field drift metal oxide semiconductor (FDMOS) transistors are commonly used because of their ability to withstand heavy loads. As the development of integrated circuits progresses, improving laterally diffused metal oxide semiconductor (LDMOS) transistors and field drift metal oxide semiconductor (FDMOS) transistors is an increasingly important issue.

SUMMARY OF THE INVENTION

The present invention provides a laterally diffused metal oxide semiconductor (LDMOS) and a field drift metal oxide semiconductor (FDMOS), where each has a doped region under a drain region that is not directly below a drain contact, for increasing device robustness.

The present invention provides a laterally diffused metal oxide semiconductor (LDMOS). A substrate has a deep well of a second conductive type. A gate is disposed on the substrate. A first doped region of a second conductive type is located in the deep well and at a side of the gate. A drain region of a second conductive type is located in the first doped region. A drain contact is disposed on the drain region. A doped region with a first conductive type is located in the first doped region and under the drain region but not directly below the drain contact. A second doped region of a first conductive type is located in the deep well and at an opposite side of the gate corresponding to the side of the gate. A source region is located in the second doped region.

The present invention provides a field drift metal oxide semiconductor (FDMOS). A substrate has a deep well of a second conductive type. A gate is disposed on the substrate. A first doped region of a second conductive type is located in the deep well and at a side of the gate. A drain region of a second conductive type is located in the first doped region. A drain contact is disposed on the drain region. A doped region of a first conductive type is located in the first doped region and under the drain region but not directly below the drain contact. An isolation structure is disposed on the substrate between the gate and the first doped region. A source region is located in the deep well and at an opposite side of the gate corresponding to the side of the gate.

According to the above, the present invention provides a laterally diffused metal oxide semiconductor and a field drift metal oxide semiconductor, which forms a doped region under a drain region but is not directly below a drain contact. Thus, currents flowing from a source region to a drain region can be concentrated in an efficient way. The currents can be concentrated and flow to the drain contact only through the drain region directly below the drain contact without flowing to the other parts of the drain region blocked by the doped region. Local heat concentration, which would cause the device to shut down, can be prevented. Therefore, the electrical performance of the device such as the device robustness, and especially the machine model (MM) robustness, can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
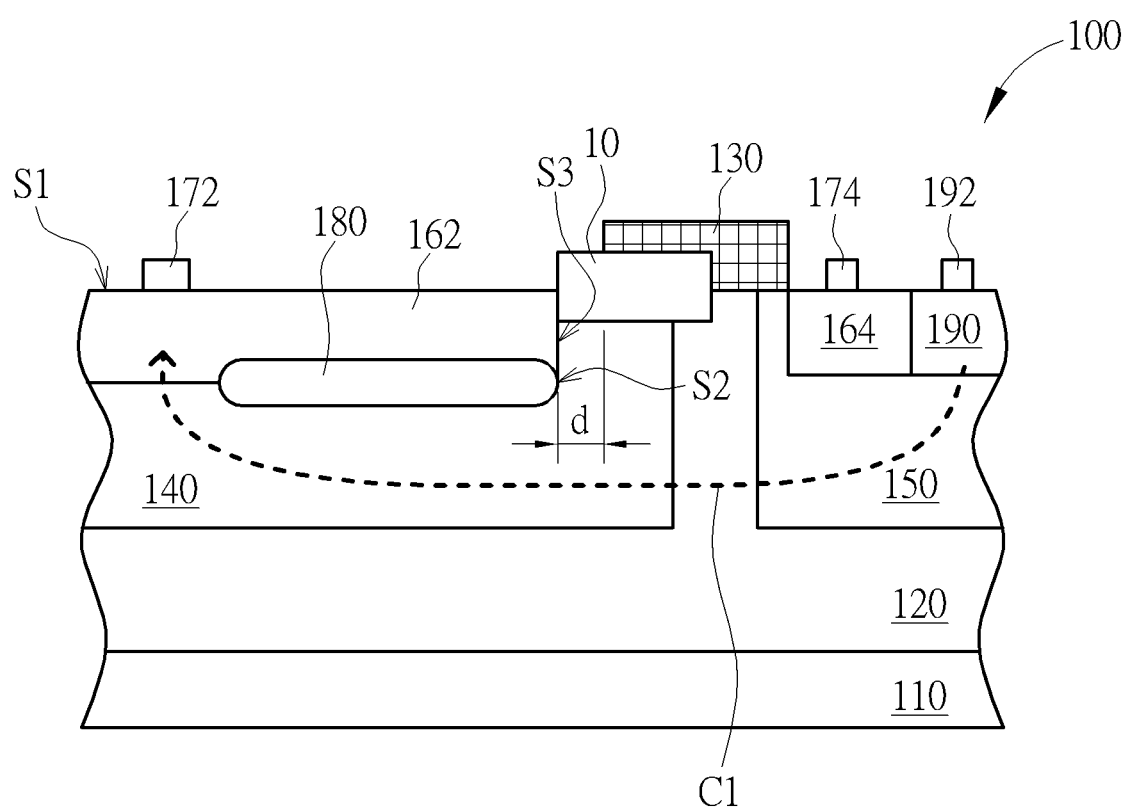
FIG. 1 schematically depicts a cross-sectional view of a laterally diffused metal oxide semiconductor according to a first embodiment of the present invention.

FIG. 1 schematically depicts a cross-sectional view of a laterally diffused metal oxide semiconductor (LDMOS) according to a first embodiment of the present invention. As shown in FIG. 1, a laterally diffused metal oxide semiconductor 100 is provided. The laterally diffused metal oxide semiconductor 100 includes a substrate 110, a deep well 120, a gate 130, a first doped region 140, a second doped region 150, a drain region 162, a drain contact 172, a doped region 180, a source region 164 and a source contact 174.

The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Preferably, the substrate 110 has a first conductive type. The deep well 120 is in the substrate 110 and has a second conductive type. In this embodiment, the first conductive type is P-type while the second conductive type is N-type. The gate 130 is disposed on the substrate 110. In this embodiment, the gate 130 is a polysilicon gate, but is not limited thereto. In another embodiment, the gate 130 may be a metal gate. The gate 130 may include a stacked structure including a buffer layer, a dielectric layer, an electrode layer, or a cap layer.

The first doped region 140 is located in the deep well 120 and at a side of the gate 130. The second doped region 150 is also located in the deep well 120 but is located at an opposite side of the gate 130 corresponding to the side of the gate 130. The first doped region 140 has a second conductive type while the second doped region 150 has a first conductive type, but is not limited thereto. In this embodiment, the first doped region 140 is an N drift region while the second doped region 150 is a P body region.

A drain region 162 is located in the first doped region 140 and at the left side of the gate 130. Correspondingly, a source region 164 is located in the second doped region 150 and at the right side of the gate 130. The drain region 162 and the source region 164 all have a second conductive type. A drain contact 172 and a source contact 174 are located directly on the drain region 162 and the source region 164 respectively.

An isolation structure 10 may be optionally disposed on the substrate 110 between the gate 130 and the first doped region 140. The isolation structure 10 may be a shallow trench isolation structure or a field oxide structure etc., depending upon the need for preventing the laterally diffused metal oxide semiconductor 100 from crashing while a high voltage is applied. Preferably, the isolation structure 10 can be omitted while a voltage under 18 volts is applied; however, the isolation structure 10 must be disposed while a voltage higher than 40 volts is applied.

An assisting doped region 190 may be disposed adjacent to the source region 164, and a contact 192 is therefore disposed directly thereon for tuning currents flowing through the laterally diffused metal oxide semiconductor 100. The assisting doped region 190 will have a different conductive type from the source region 164. In this embodiment, the source region 164 has a second conductive type, and the assisting doped region 190 thus has a first conductive type, but is not limited thereto.

In the present invention, the doped region 180 having a first conductive type is located in the first doped region 140 and under the drain region 162. It should be emphasized, however, that the doped region 180 is not directly below the drain contact 172. In this embodiment, the doped region 180 is only located between the drain contact 172 and the gate 130, but this is not limited thereto. Please refer to FIG. 1. While the laterally diffused metal oxide semiconductor 100 has a current C1 flowing from the source region 164 or the assisting doped region 190 to the drain region 162, the current C1 can be concentrated and flow to the drain contact 172 only through the drain region 162 directly below the drain contact 172 without flowing to the other parts of the drain region 162 blocked by the doped region 180. Thus, the current C1 is concentrated to flow through the substrate 110 in an efficient way and local heat concentration, which generally occurs in the end of the drain region 162 connecting the gate or the isolation structure 10 and causing device shot down, can be prevented. Therefore, the electrical performance of the device such as the device robustness, and especially the machine model (MM) robustness, can be improved. For example, in the present invention, as the human body model (HBM) value is 8 kV, the machine model (MM) value can approach 800V. For a laterally diffused metal oxide semiconductor having a doped region directly below a drain contact, the machine model (MM) value can only achieve 300 V (volts) while the human body model (HBM) value is 8 kV (kilovolts). For a laterally diffused metal oxide semiconductor without any doped region under a drain region, the machine model (MM) value is just 550V while the human body model (HBM) value is just 4 kV.

One side S2 of the doped region 180 near the gate 130 is trimmed with one side S3 of the drain region 162 near the gate 130 in this embodiment. The doped region 180 can block currents from passing through this area, which ensures that the path of the current C1 can be concentrated. In another embodiment, the side S3 of the doped region 162 near the gate 130 is at a horizontal distance d from the gate 130, which is closer than the distance between the side S3 of the drain region 162 and the gate 130. Thus, this embodiment can also have the function of blocking currents.

In this embodiment, the doped region 162 is trimmed with the isolation structure 10 without overlapping it. In another embodiment, a part of the doped region 162 may be directly below the isolation structure 10 for blocking currents and preventing local heating concentration, depending upon the requirements.

The step of forming the laterally diffused metal oxide semiconductor 100 may include the following. The substrate 110 is provided. A doping process such as an implantation process or a diffusing process etc. is performed to form the deep well 120 in the substrate 110. In this embodiment, the deep well 120 has a depth of 0~15 micrometers and the dopant concentration is at a range of $10^{15}$~$10^{17}$ (1/cm$^3$). The isolation structure 10 may be optionally formed by a method such as a thermal oxide process or a chemical oxide process etc. The first doped region 140 and the second doped region 150 are then formed. The order of forming the first doped region 140 and the second doped region 150 is not restricted. In one case, the first doped region 140 may be formed and then the second region 150 is formed; in the other case, the second region 150 may be formed and then the first doped region 140 is formed, depending upon the needs. In this embodiment, the first doped region 140 and the second doped region 150 are formed by an implantation process or a diffusing process etc. The first doped region 140 and the second doped region 150 all have depths of 0~3 micrometers and the dopant concentration is at a range of $10^{16}$~$10^{18}$ (1/cm$^3$). The gate 130 is formed on the substrate 110 by methods such as a deposition process and a patterned process. Then, the doped region 180 is formed by a method such as an implantation process or a diffusing process etc. In this embodiment, the doped region 180 has a depth of 0~2 micrometers and the dopant concentration is at a range of $10^{17}$~$10^{19}$ (1/cm$^3$). Then, the drain region 162 and the source region 164 are formed by a method such as an implantation process or a diffusing process etc. In this embodiment, the drain region 162 and the source region 164 all have depths of 0~1 micrometers and the dopant concentration is at a range of $10^{15}$~$10^{21}$ (1/cm$^3$). Optionally, the assisting doped region 190 may be formed by a method such as an implantation process or a diffusing process etc. The assisting doped region 190 may have a depth of 0~1 micrometers and the dopant concentration is at a range of $10^{15}$~$10^{21}$ (1/cm$^3$). Then, the drain contact 172, the source contact 174 and the contact 192 are formed on the drain region 162, the source region 164 and the assisting doped region 190 respectively. The drain contact 172, the source contact 174 and the contact 192 may be formed by a filling process after a patterned inter-dielectric layer is entirely formed on the substrate 110, but is not limited thereto. Thereafter, sequential processes may be performed on the substrate 110, such as an interconnect forming process, to electrically connect the drain region 162 and the source region 164 to external circuits.

It is emphasized that the doped region 180 having a first conductive type is formed in the first doped region 140 having a second conductive type and under the drain region 162 having a second conductive type, but is not directly below the drain contact 172. Any layout that can satisfy this requirement can be an embodiment of the present invention. There are four embodiments presented herein to clarify and illustrate the present invention, but the present invention is not restricted thereto. FIGS. 2-5 depict layouts of four laterally diffused metal oxide semiconductors. These laterally diffused metal oxide semiconductors are similar to the laterally diffused metal oxide semiconductor 100 of FIG. 1. For simplifying the present invention, similar symbols are used in the four embodiments to correspond to the laterally diffused metal oxide semiconductor 100 of FIG. 1 and their relative locations and processing steps are not described again.

Figure 2:
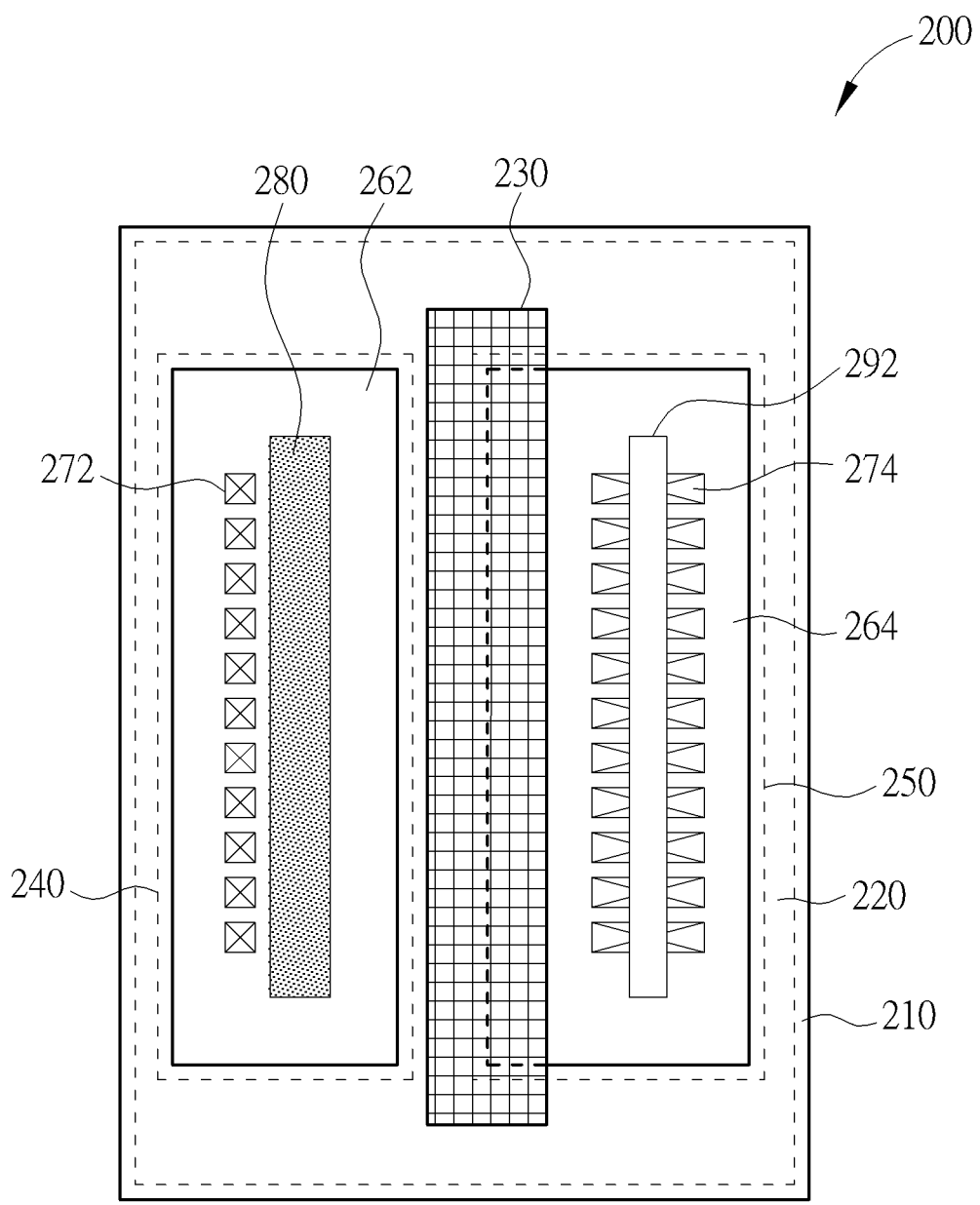
FIG. 2 schematically depicts a top view of a laterally diffused metal oxide semiconductor according to an embodiment of the present invention.

FIG. 2 schematically depicts a top view of a laterally diffused metal oxide semiconductor according to an embodiment of the present invention. As shown in FIG. 2, the laterally diffused metal oxide semiconductor 200 has a doped region 280 between a drain contact 272 and a gate 230. More precisely, the doped region 280 is right next to the drain contact 272 and is below a part of the drain region 262. In this embodiment, the doped region 280 is rectangular and parallel to the gate 230, but it is not limited thereto.

Figure 3:
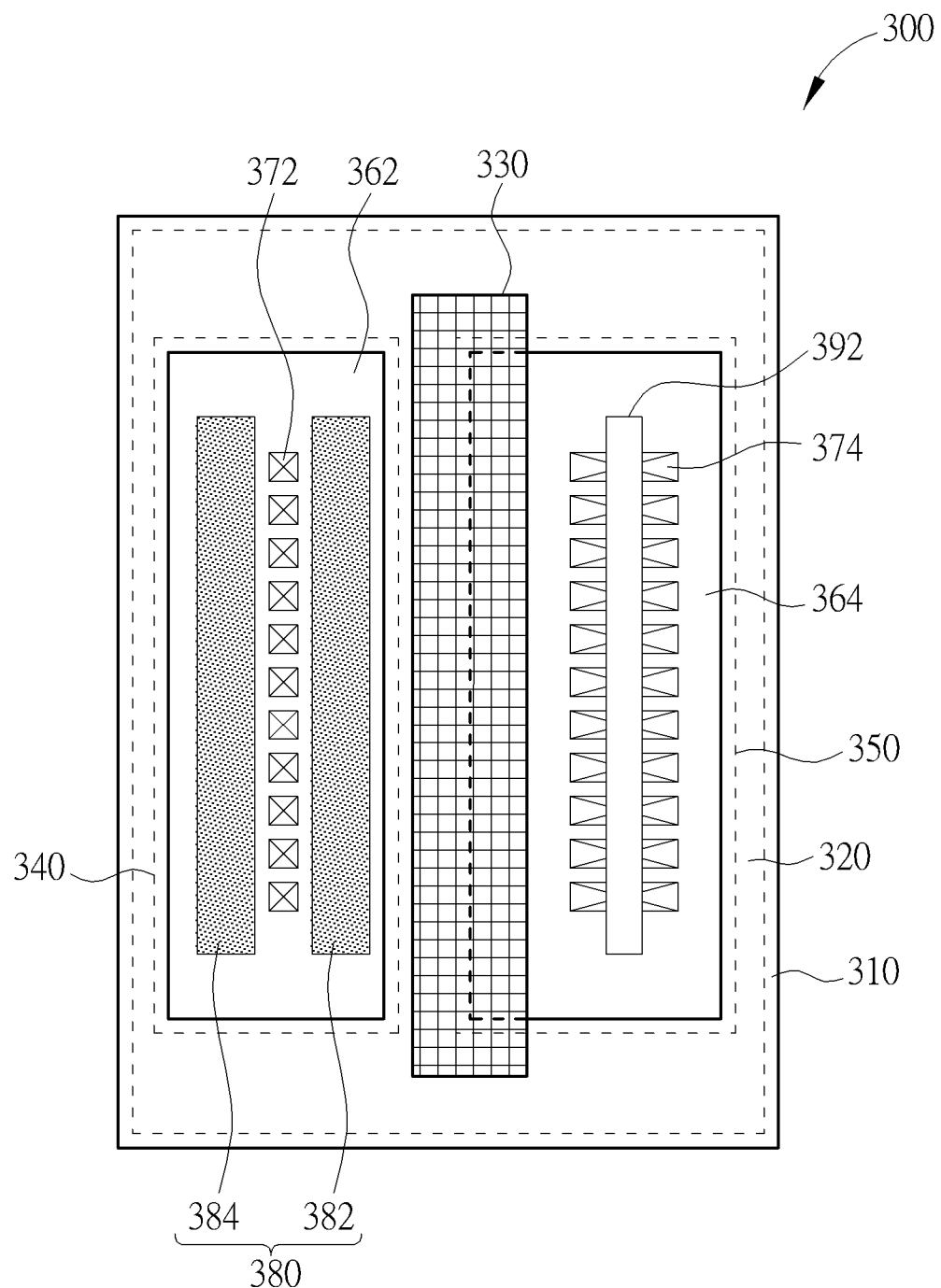
FIG. 3 schematically depicts a top view of a laterally diffused metal oxide semiconductor according to an embodiment of the present invention.

FIG. 3 schematically depicts a top view of a laterally diffused metal oxide semiconductor according to an embodiment of the present invention. As shown in FIG. 3, the laterally diffused metal oxide semiconductor 300 has a doped region 380 including a first doped region 382 and a second doped region 384 beside two sides of a drain contact 372, respectively. The first doped region 382 and the second doped region 384 are all rectangular and parallel to a gate 330, but are not limited thereto. More precisely, the first doped region 382 and the second doped region 384 are under a part of a drain region 362 and right next to the drain contact 372. Only the first doped region 382 is between the drain contact 372 and the gate 330.

Figure 4:
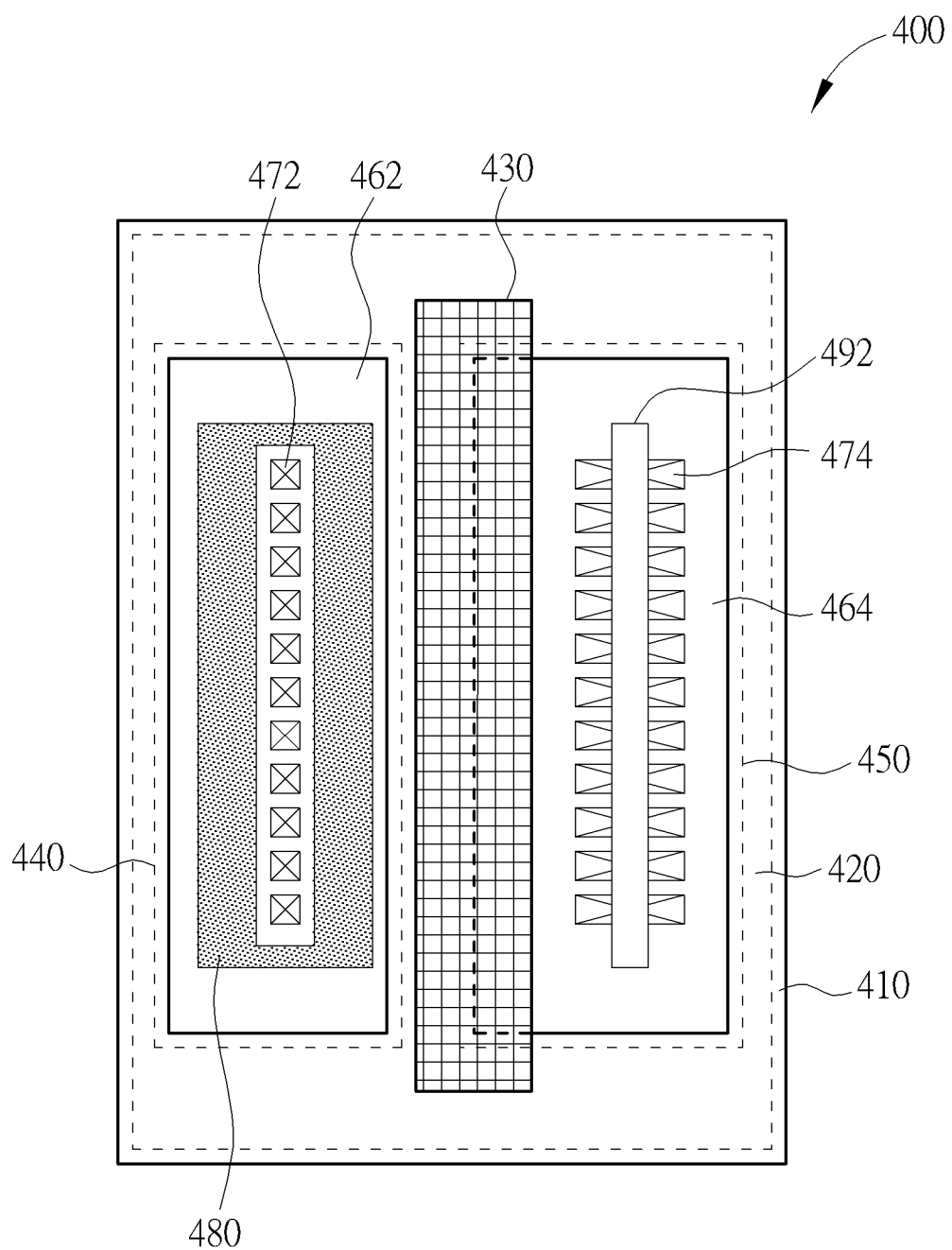
FIG. 4 schematically depicts a top view of a laterally diffused metal oxide semiconductor according to an embodiment of the present invention.

FIG. 4 schematically depicts a top view of a laterally diffused metal oxide semiconductor according to an embodiment of the present invention. As shown in FIG. 4, the laterally diffused metal oxide semiconductor 400 has a doped region 480 surrounding the drain contact 472 and the doped region 480 is a closed frame.

Figure 5:
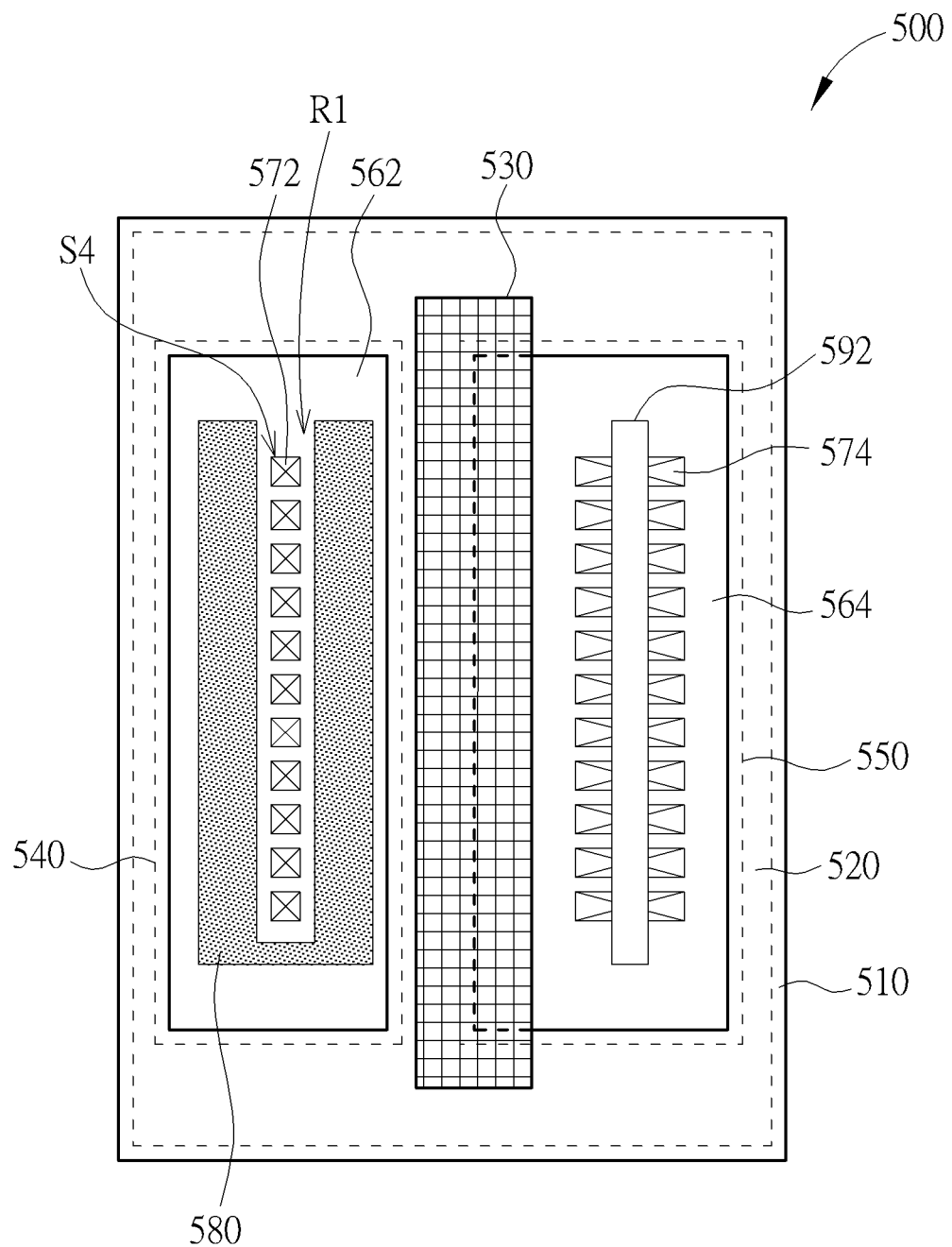
FIG. 5 schematically depicts a top view of a laterally diffused metal oxide semiconductor according to an embodiment of the present invention.

FIG. 5 schematically depicts a top view of a laterally diffused metal oxide semiconductor according to an embodiment of the present invention. As shown in FIG. 5, the laterally diffused metal oxide semiconductor 500 has a doped region 580 surrounding the drain contact 572, but the doped region 580 has an opening R1 corresponding to a side S4 of the drain contact 572. The opening R1 may correspond to the other sides of the drain contact 572, but is not limited thereto.

According to the four embodiments, the doped regions 280/380/480/580 are only under a part of the drain regions 262/362/4692/562. The doped ranges of the doped regions 280/380/480/580 are not restricted thereto. In one case, the doped regions 280/380/480/580 may respectively be located under the whole drain regions 262/362/462/562 between the drain contacts 272/372/472/572 and the gate 230/330/430/530. Furthermore, each of the drain contacts 272/372/472/572 has a plurality of small drain contacts arranged in a regular fashion. The doped region 280/380/480/580 may extend laterally between these small drain contacts.

Laterally diffused metal oxide semiconductors 100/200/300/400/500 having the doped region 180/280/380/480/580 are provided. The present invention can also be applied to other semiconductor structures such as field drift metal oxide semiconductors, and is not limited thereto. Field drift metal oxide semiconductors are provided in the following.

Figure 6:
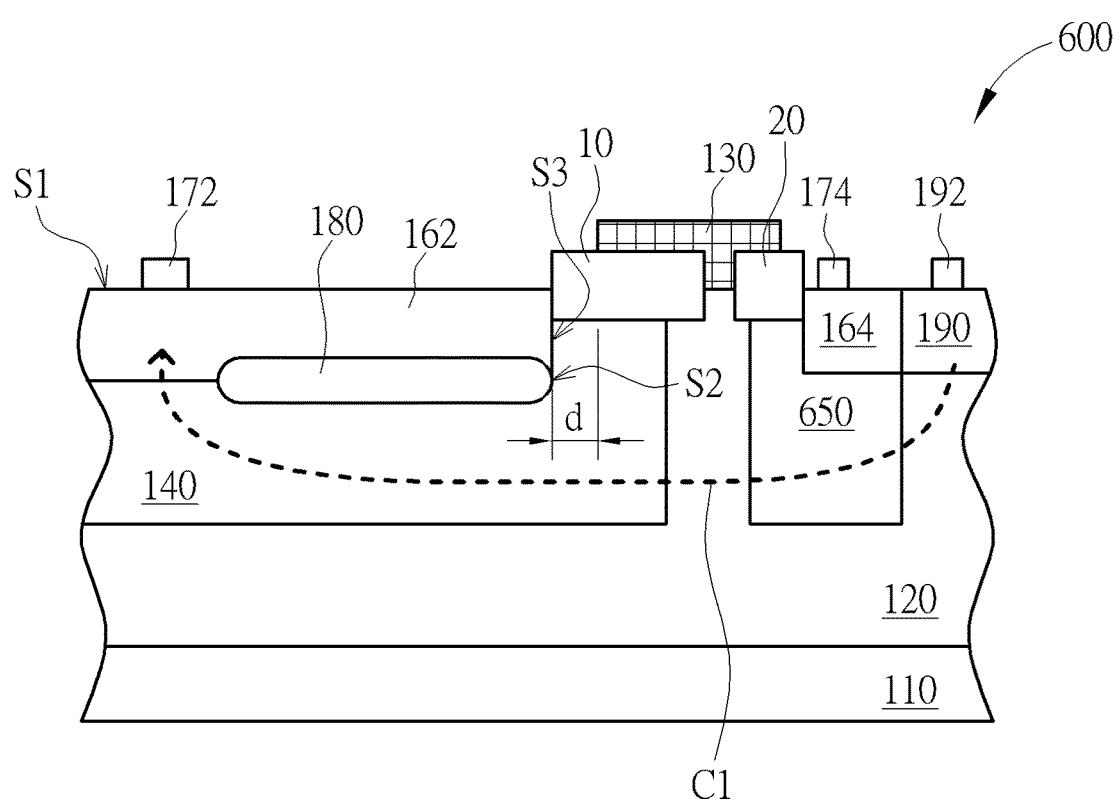
FIG. 6 schematically depicts a cross-sectional view of a field drift metal oxide semiconductor according to a second embodiment of the present invention.

FIG. 6 schematically depicts a cross-sectional view of a field drift metal oxide semiconductor (FDMOS) according to a second embodiment of the present invention. As shown in FIG. 6, the field drift metal oxide semiconductor 600 is similar to the laterally diffused metal oxide semiconductor of FIG. 1. The difference is: the second doped region 150 in the first embodiment of FIG. 1 is canceled in the field drift metal oxide semiconductor 600. Instead, a second doped region 650 having a second conductive type may be optionally formed in the deep well 120 and below the source region 174 without contacting the assisting doped region 190. Furthermore, the deep well 120 has a first conductive type in this embodiment, but it is not limited thereto; a first isolation structure 20 may be optionally disposed on the substrate 110 between the gate 130 and the source region 164. The first isolation structure 20 may be a shallow trench isolation structure or a field oxide structure etc.

Likewise, a doped region 180 of the field drift metal oxide semiconductor 600 has a first conductive type and is located in a first doped region 140 and under a drain region 162. It should be emphasized that the doped region 180 is not directly below a drain contact 172. In this embodiment, the doped region 180 is only between the drain contact 172 and a gate 130, but it is not limited thereto. While the field drift metal oxide semiconductor 600 has a current C2 flowing from the source region 164 to the drain region 162, the current C2 can be concentrated and flow to the drain contact 172 through the drain region 162 directly below the drain contact 172 without flowing to the other parts of the drain region 162 blocked by the doped region 180. Thus, the current C2 is concentrated to flow through the substrate 110 in an efficient way and local heat concentration which generally occurs in the end of the drain region 162 connecting the gate or the isolation structure 10 and causes device shut down can be prevented. Therefore, the electrical performance of the device such as the device robustness, and especially the machine model (MM) robustness, can be improved.

In this embodiment, one side S2 of the doped region 180 near the gate 130 is trimmed with one side S3 of the drain region 162 near the gate 130. Thus, the doped region 180 can block currents from passing this through area, and the path of the current C2 can be concentrated. In another embodiment, the side S2 of the doped region 162 near the gate 130 is at a horizontal distance d from the gate 130, which is closed than the distance between the side S3 of the drain region 162 and the gate 130. Thus, this embodiment can also have the function of blocking currents.

In this embodiment, the doped region 162 is trimmed with the isolation structure 10 without overlapping it. In another embodiment, a part of the doped region 162 may be directly below the isolation structure 10 for blocking currents and preventing local heating concentration, depending upon the requirements.

It is emphasized that the field drift metal oxide semiconductor 600 includes the doped region 180 having a first conductive type in the first doped region 140 having a second conductive type and under the drain region 162 having a second conductive type, but the doped region 180 is not directly below the drain contact 172. Thus, layouts that can satisfy this requirement can be embodiments of the present invention. There are four embodiments presented to clarify and illustrate the present invention, but the present invention is not restricted thereto.

FIGS. 7-10 depict layouts of four field drift metal oxide semiconductors. These field drift metal oxide semiconductors are similar to the field drift metal oxide semiconductor 600 of FIG. 6. For simplifying the present invention, similar symbols are used in the four embodiments to correspond to the field drift metal oxide semiconductor 600 of FIG. 6 and their relative locations and processing steps are not described again.

Figure 7:
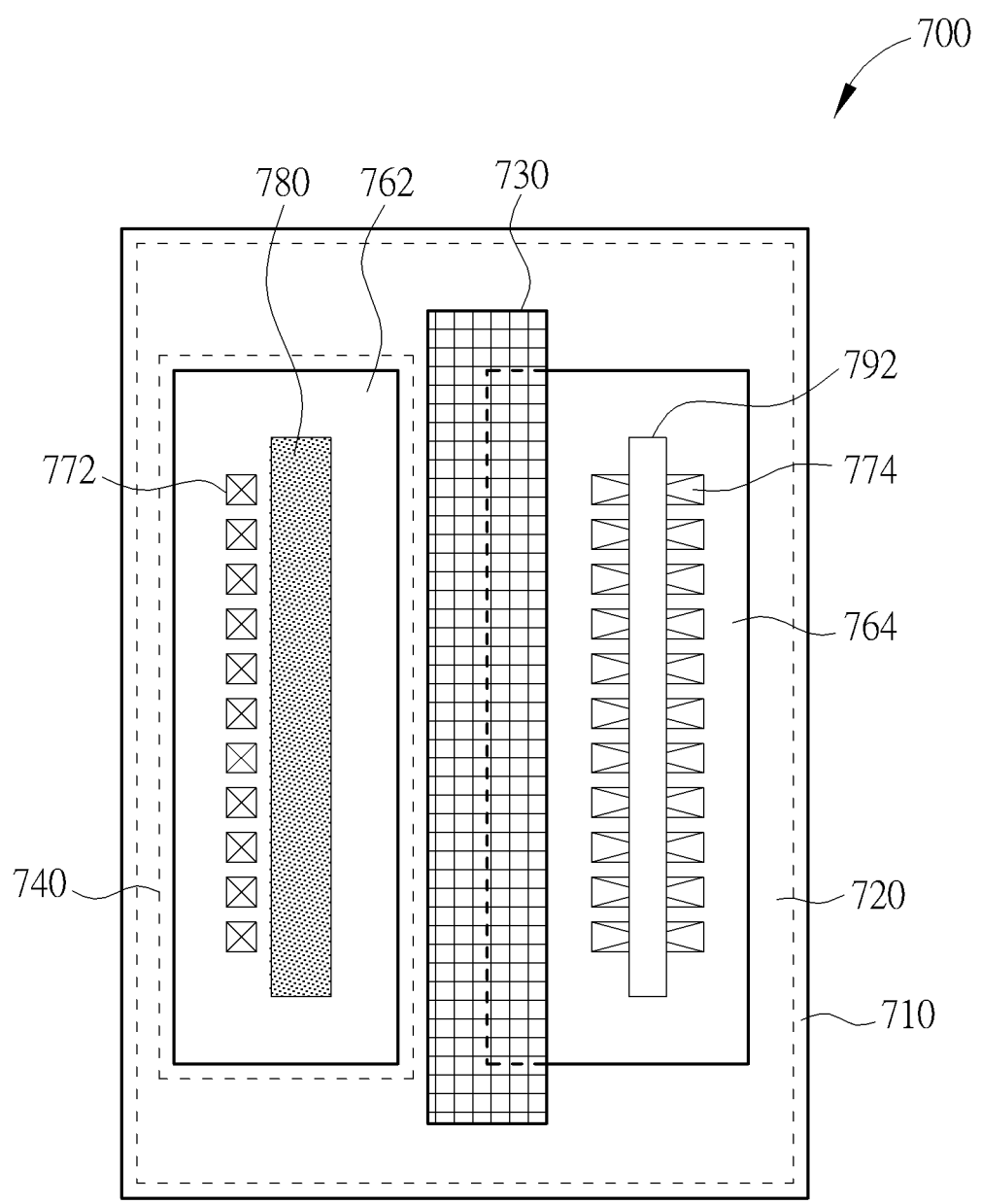
FIG. 7 schematically depicts a top view of a field drift metal oxide semiconductor according to an embodiment of the present invention.

FIG. 7 schematically depicts a top view of a field drift metal oxide semiconductor according to an embodiment of the present invention. As shown in FIG. 7, the field drift metal oxide semiconductor 700 has a doped region 780 only located between a drain contact 772 and a gate 730. The doped region 780 is next to the drain contact 772 and is below a part of the drain region 762. In this embodiment, the doped region 280 is rectangular and parallel to the gate 730, but it is not limited thereto.

Figure 8:
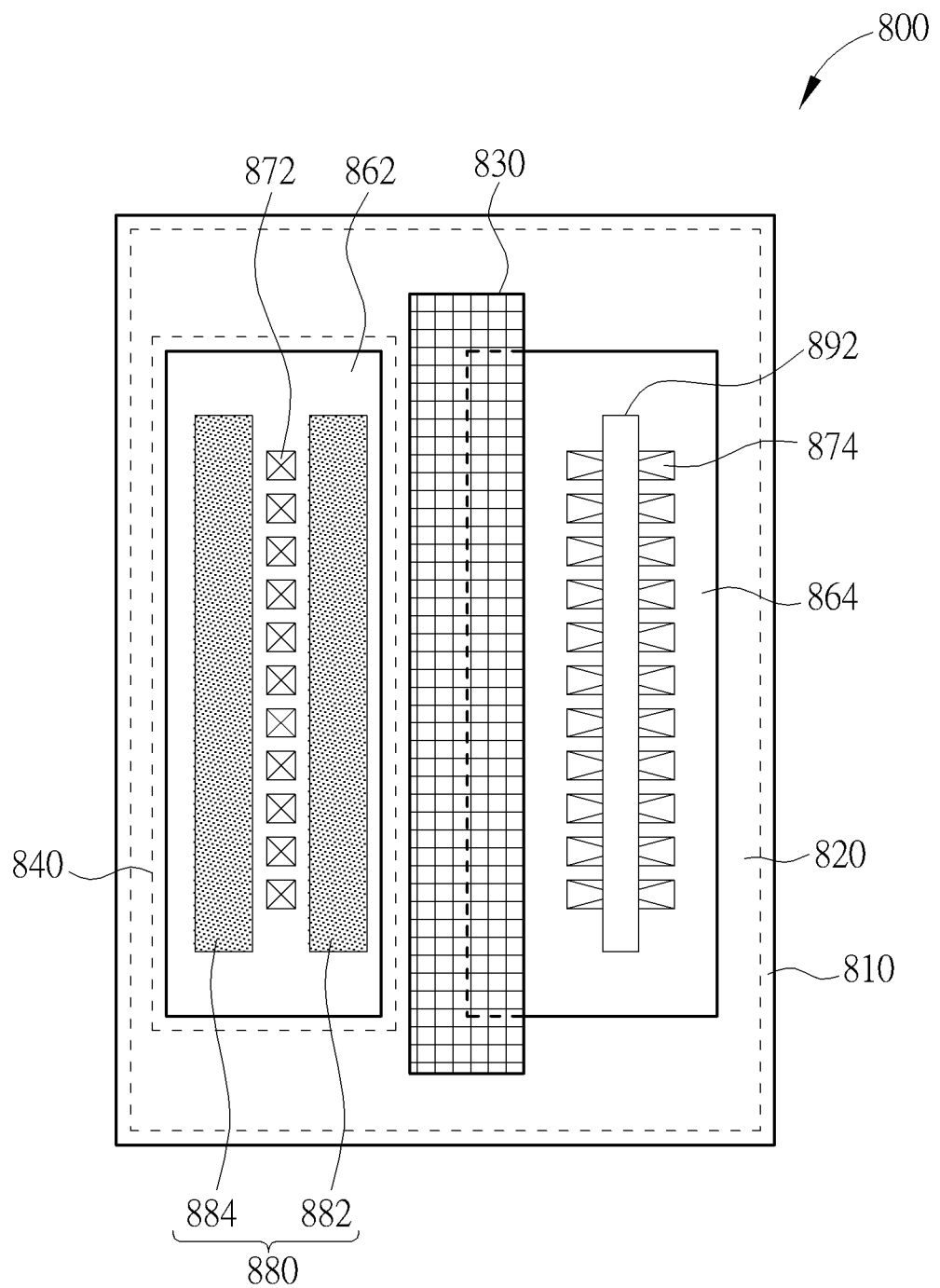
FIG. 8 schematically depicts a top view of a field drift metal oxide semiconductor according to an embodiment of the present invention.

FIG. 8 schematically depicts a top view of a field drift metal oxide semiconductor according to an embodiment of the present invention. As shown in FIG. 8, the field drift metal oxide semiconductor 800 has a doped region 880 including a first doped region 882 and a second doped region 884 at two sides of a drain contact 872 respectively and under a part of a drain region 862. The first doped region 382 and the second doped region 384 are all rectangular and parallel to a gate 330, but are not limited thereto.

Figure 9:
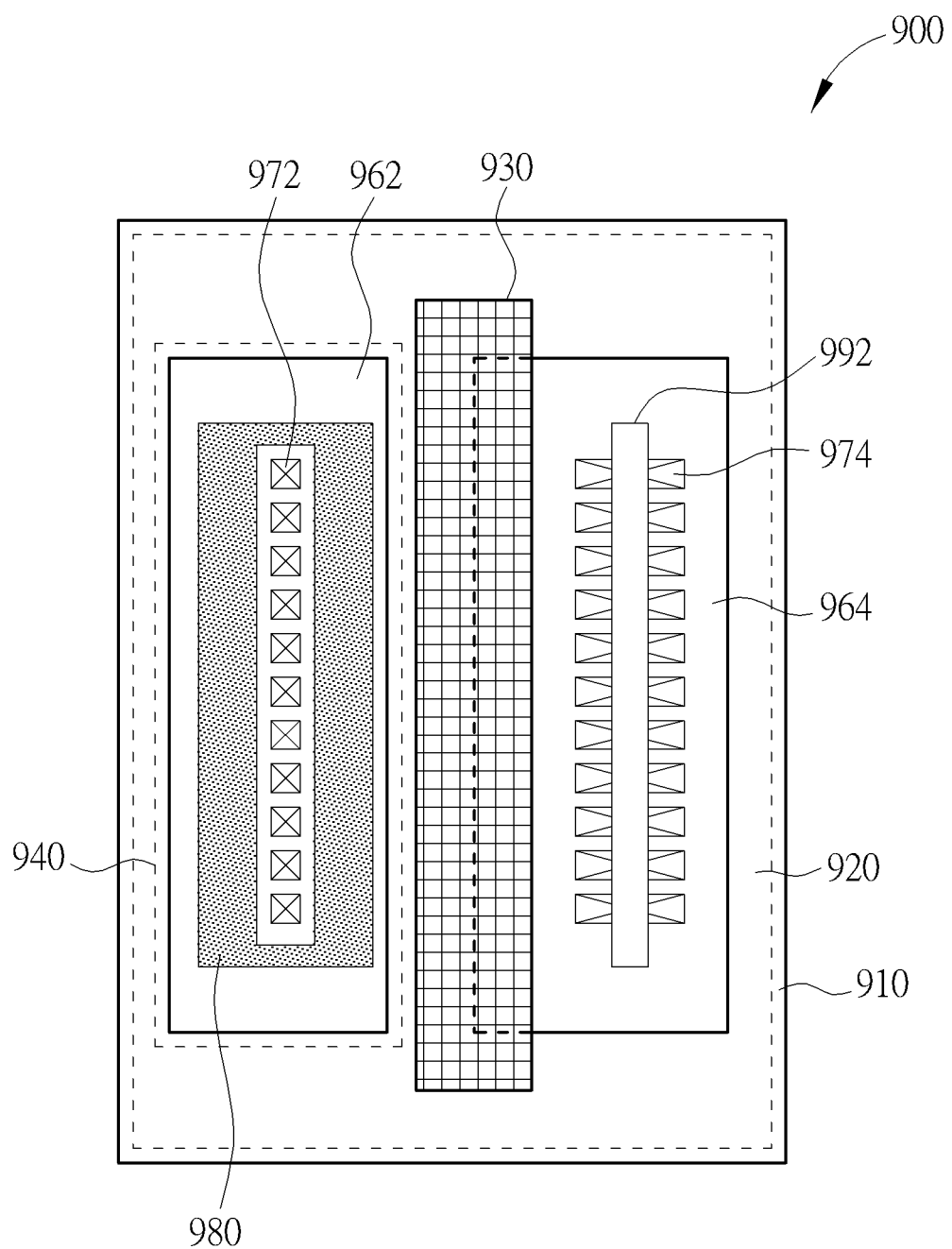
FIG. 9 schematically depicts a top view of a field drift metal oxide semiconductor according to an embodiment of the present invention.

FIG. 9 schematically depicts a top view of a field drift metal oxide semiconductor according to an embodiment of the present invention. As shown in FIG. 9, the field drift metal oxide semiconductor 900 has a doped region 980 being a closed frame surrounding the drain contact 972.

Figure 10:
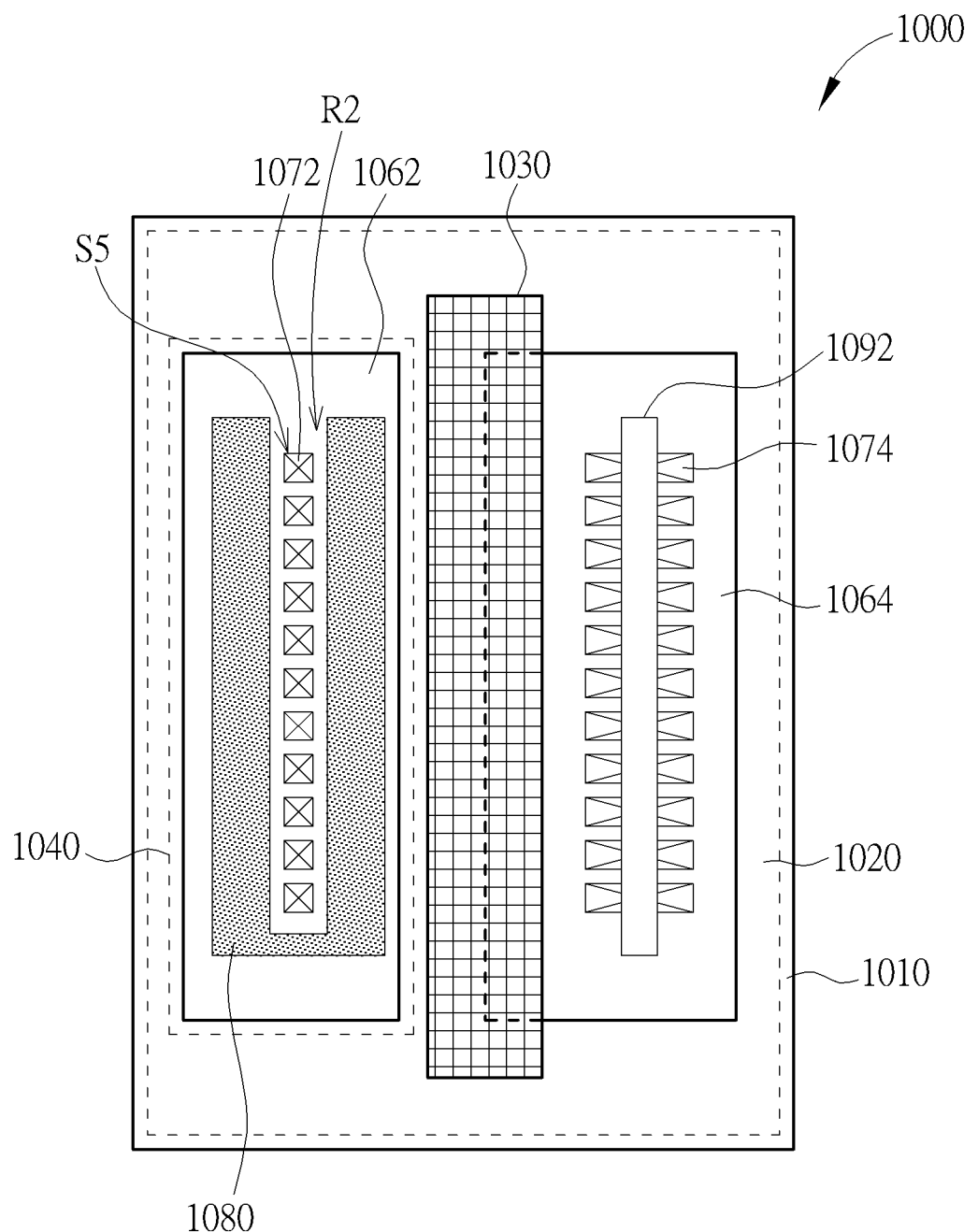
FIG. 10 schematically depicts a top view of a field drift metal oxide semiconductor according to an embodiment of the present invention.

FIG. 10 schematically depicts a top view of a field drift metal oxide semiconductor according to an embodiment of the present invention. As shown in FIG. 10, the field drift metal oxide semiconductor 1000 has a doped region 1080 surrounding the drain contact 1072, but the doped region 1080 has an opening R2 corresponding to a side S5 of the drain contact 1072. In another embodiment, the opening R2 may correspond to the other sides of the drain contact 1072, but is not limited thereto.

To summarize, the present invention provides a laterally diffused metal oxide semiconductor and a field drift metal oxide semiconductor, which forms a doped region under a drain region that is not directly below a drain contact. Thus, currents flowing from a source region to a drain region can be concentrated in an efficient way. These currents can be concentrated to only flow to the drain contact through the drain region directly below the drain contact without flowing to the other parts of the drain region blocked by the doped region. Meanwhile, local heat concentration which could cause a device shut down can be prevented. Therefore, the electrical performance of the device such as the device robustness can be improved.

Layouts of the doped region for a laterally diffused metal oxide semiconductor or a field drift metal oxide semiconductor may be a doped region only between a drain contact and a gate, a doped region between two sides of a drain contact, a doped region being a closed frame surrounding a drain contact, or a doped region surrounding a drain contact but with an opening corresponding to one side of the drain contact.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A laterally diffused metal oxide semiconductor (LDMOS), comprising:
   a substrate having a deep well of a second conductive type;
   a gate disposed on the substrate;
   a first doped region of a second conductive type located in the deep well and at a side of the gate;
   a drain region of a second conductive type located in the first doped region;
   a drain contact disposed on the drain region;
   a doped region of a first conductive type located in the first doped region and under the drain region but not directly below the drain contact, wherein one side of the doped region near the gate is trimmed with one side of the drain region near the gate;
   a second doped region of a first conductive type located in the deep well and at an opposite side of the gate corresponding to the side of the gate;
   a source region located in the second doped region; and
   an isolation structure disposed on the substrate between the gate and the drain region, wherein one side of the doped region near the gate is trimmed with one side of the isolation structure, and the doped region is not vertically below the isolation structure.

2. The laterally diffused metal oxide semiconductor according to claim 1, wherein the doped region is between the drain contact and the gate, and the doped region is parallel to the drain contact.

3. The laterally diffused metal oxide semiconductor according to claim 1, wherein the doped region comprises a first doped region and a second doped region at two sides of the drain contact, respectively, and the first doped region, the second doped region and the drain contact are parallel to each other.

4. The laterally diffused metal oxide semiconductor according to claim 1, wherein the doped region completely surrounds the drain contact.

5. The laterally diffused metal oxide semiconductor according to claim 1, wherein the doped region partially surrounds the drain contact but has an opening corresponding to one side of the drain contact.

6. The laterally diffused metal oxide semiconductor according to claim 1, wherein a horizontal distance between one side of the doped region and the gate is closer than a horizontal distance between one side of the drain region and the gate.

* * * * *